United States Patent [19]
Arnold et al.

[11] Patent Number: 5,510,756
[45] Date of Patent: Apr. 23, 1996

[54] STRIP TRANSMISSION LINE HAVING A TUNABLE ELECTRIC LENGTH

[75] Inventors: Wolfgang Arnold, Aspach; Erich Pivit, Allmersbach; Wolfgang Weiser, Aspach; Seigbert Martin, Oppenweiler, all of Germany

[73] Assignee: AFT Advanced Ferrite Technology, Backnang, Germany

[21] Appl. No.: 321,522

[22] Filed: Oct. 12, 1994

[30] Foreign Application Priority Data

Oct. 14, 1993 [DE] Germany ............... 43 34 977.3

[51] Int. Cl.⁶ .............. H01P 7/06; H03J 3/16
[52] U.S. Cl. .............. 333/223; 333/235; 333/246
[58] Field of Search .............. 315/39.55, 39.59, 315/5.41, 5.46; 333/235, 205, 246, 222, 223, 224, 225, 226, 202, 231, 219.2, 221

[56] References Cited

U.S. PATENT DOCUMENTS

| | | | |
|---|---|---|---|
| 3,333,148 | 7/1967 | Buck | 333/232 |
| 5,075,654 | 12/1991 | Martin et al. | 333/231 |
| 5,101,182 | 3/1992 | Babbitt et al | 333/205 |

OTHER PUBLICATIONS

Kinberg et al, "Non–Linear Controllable Transmission Lines",IBM Technical Disclosure Bulletin, vol. 2, No. 6, Apr. 1960, pp. 108,109.

Primary Examiner—Benny Lee
Assistant Examiner—David H. Vu
Attorney, Agent, or Firm—Spencer & Frank

[57] ABSTRACT

A strip transmission line for guiding a wave therein, including a strip-shaped inner conductor; an outer conductor surrounding the inner conductor with a clearance; a ferrite coating carried on at least one of the conductors; and at least one throughgoing slot provided in the inner and outer conductors for dividing the inner and outer conductors into at least two inner conductor sections and at least two outer conductor sections. The slots extend in a direction of wave propagation, whereby a variable current applied to the inner and outer conductors flows in one direction in one of the inner and outer conductor sections and returns in an opposite direction in another of the inner and outer conductor sections for generating a variable premagnetizing field within the strip transmission line between the inner and outer conductors to vary an electric length of the strip transmission line.

5 Claims, 3 Drawing Sheets

5,510,756

STRIP TRANSMISSION LINE HAVING A TUNABLE ELECTRIC LENGTH

CROSS REFERENCE TO RELATED APPLICATION

This application claims the priority of German Application No. P 43 34 977.3 filed Oct. 14, 1993, which is incorporated herein by reference.

BACKGROUND OF THE INVENTION

This invention relates to a strip transmission line whose electric length may be adjusted by a variable premagnetizing field affecting the ferrite material with which a strip-shaped inner conductor and/or an outer conductor surrounding the inner conductor is at least partially coated.

A strip transmission line of the above-outlined type is disclosed, for example, in published European Application 429 791. Since the electric length of the strip transmission line is variable, it may be used, for example, for the tuning of resonators. Since such a tuning device for a strip transmission line may be operated with very high power because of its low losses and superior cooling possibilities, it may be advantageously used in particle accelerators.

The known strip transmission line whose electric length may be varied is exposed to a premagnetizing field which has static and variable components. The static premagnetizing field generated by a permanent magnet is of such a magnitude that the ferrite in the strip transmission line is premagnetized to saturation. In the saturated state the ferrite is loss-free and upon further increase of the premagnetizing field the microwave properties of the ferrite may be influenced to such an extent that the electric length of the strip transmission line changes. The variable component of the premagnetizing field is conventionally generated by an electromagnet.

It is a disadvantage of the known arrangement that the variable premagnetizing field is generated externally of the strip transmission line, and the magnetic field has to penetrate the outer and the inner conductors of the symmetrical strip transmission line to ensure that the magnetic field has an effect on the ferrite. Since the outer and inner conductors are made of an electrically conducting material, eddy currents are generated which prevent a rapid penetration of the magnetic field into the ferrite material. The tuning speed of the strip transmission line is thus limited by the eddy currents. For example, the limit frequency is approximately 25 Hz for the tuning of a strip transmission line whose housing which serves as the outer conductor is of brass having a wall thickness of 2 mm. The limit frequency for the tuning may be increased to approximately 800 Hz if, for example, a high-grade steel is used as the housing material.

By reducing the wall thickness of the housing, the limit frequency could be further increased. Such a possibility, however, is limited by the required mechanical stability of the arrangement.

A reduction of the eddy currents could further increase the limit frequency. By providing slots in the housing the paths of the eddy currents may be interrupted. In such a case, however, it has to be taken into consideration that the slots extend parallel to the current paths of the high-frequency field of the strip transmission line so as not to interrupt the high frequency currents which would lead to an energy scattering.

It has been found that all the above-outlined measures used in a tunable strip transmission line structured according to the state of the art make possible a maximum tuning frequency of approximately 2 kHz.

SUMMARY OF THE INVENTION

It is an object of the invention to provide an improved strip transmission line of the above-outlined type whose electric length is variable at high speed.

This object and others to become apparent as the specification progresses, are accomplished by the invention, according to which, briefly stated, the wave-guiding strip transmission line includes a strip-shaped inner conductor; an outer conductor surrounding the inner conductor with a clearance; a ferrite coating carried on at least one of the conductors; and at least one throughgoing slot provided in the inner and outer conductors for dividing the inner and outer-conductors into at least two inner conductor sections and at least two outer conductor sections. The slots extend in a direction of wave propagation, whereby a variable current applied to the inner and outer conductors flows in one direction in one of the inner and outer conductor sections and returns in an opposite direction in another of the inner and outer conductor sections for generating a variable premagnetizing field within the strip transmission line between the inner and outer conductors to vary an electric length of the strip transmission line.

According to the invention, the outer and the inner conductors of the strip transmission line participate in the generation of a variable premagnetizing field. Such field thus does not have to penetrate the outer conductor (housing) so that, as a result, in the housing no eddy currents will be generated which would set a limit to the tuning frequency.

DESCRIPTION OF THE PREFERRED EMBODIMENT

Figure 1:
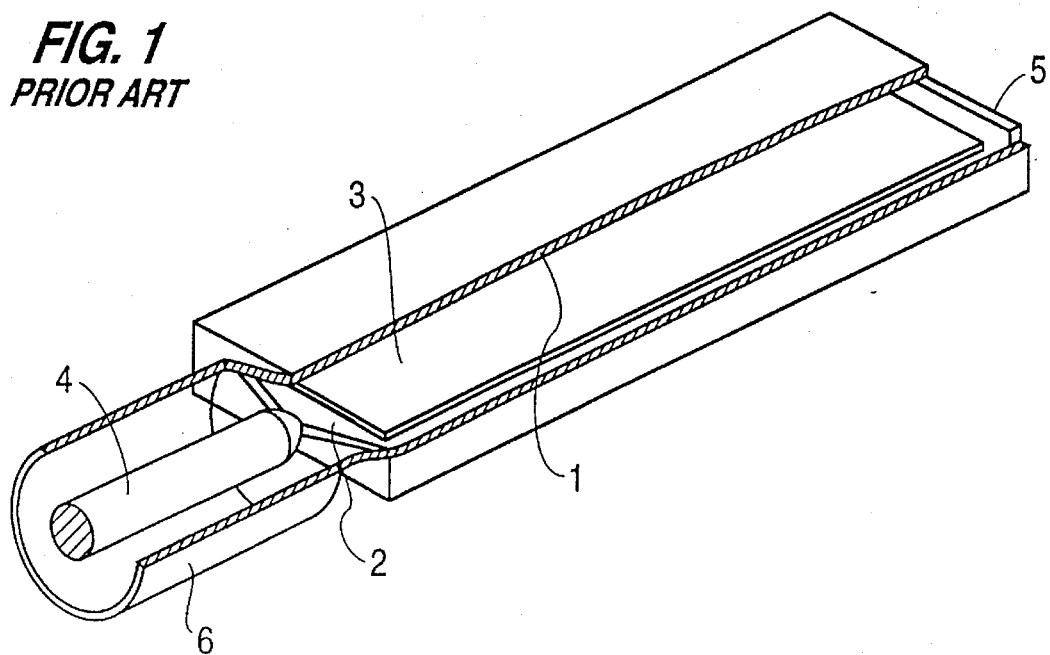
FIG. 1 is a perspective view of a strip transmission line according to the prior art.

Turning to FIG. 1, there is illustrated therein a symmetric strip transmission line according to the prior art, including a housing 1 (shown partially broken away) serving as the outer conductor (guide) and a planar inner conductor (guide) 2 arranged within the housing 1. One end of the wave guiding strip transmission line continues as a coaxial line whose outer conductor 6 is connected with the housing 1 and whose inner conductor 4 is connected with the planar inner conductor 2. The coaxial line 6, 4 connects the strip transmission line 1, 2 with, for example, a resonator to be tuned. At that end of the strip transmission line 1, 2 which is remote from the coaxial line 6, 4 a short-circuiting plate 5 is provided which establishes a contact between the outer conductor 1 and the inner conductor 2. Both sides of the planar inner conductor 2 are coated with a ferrite layer 3. Departing from the illustrated construction, a ferrite layer can be additionally or exclusively applied to the inner faces of the outer conductor 1. For cooling the ferrite layer 3, non-illustrated cooling channels may be provided in the outer conductor 1 and/or the inner conductor 2.

As noted earlier, the ferrite layer 3 is exposed to a premagnetizing field which is composed of a static magnetic field generated by a permanent magnet and a superposed, variable magnetic field which controls the electric length of the strip transmission line.

The variable premagnetizing field is generated by means of a variable current which, according to the invention, flows through the outer and inner conductors 1, 2 of the strip transmission line. For this purpose the conventional strip transmission line shown in FIG. 1 is modified in a manner now to be described.

Figure 2:
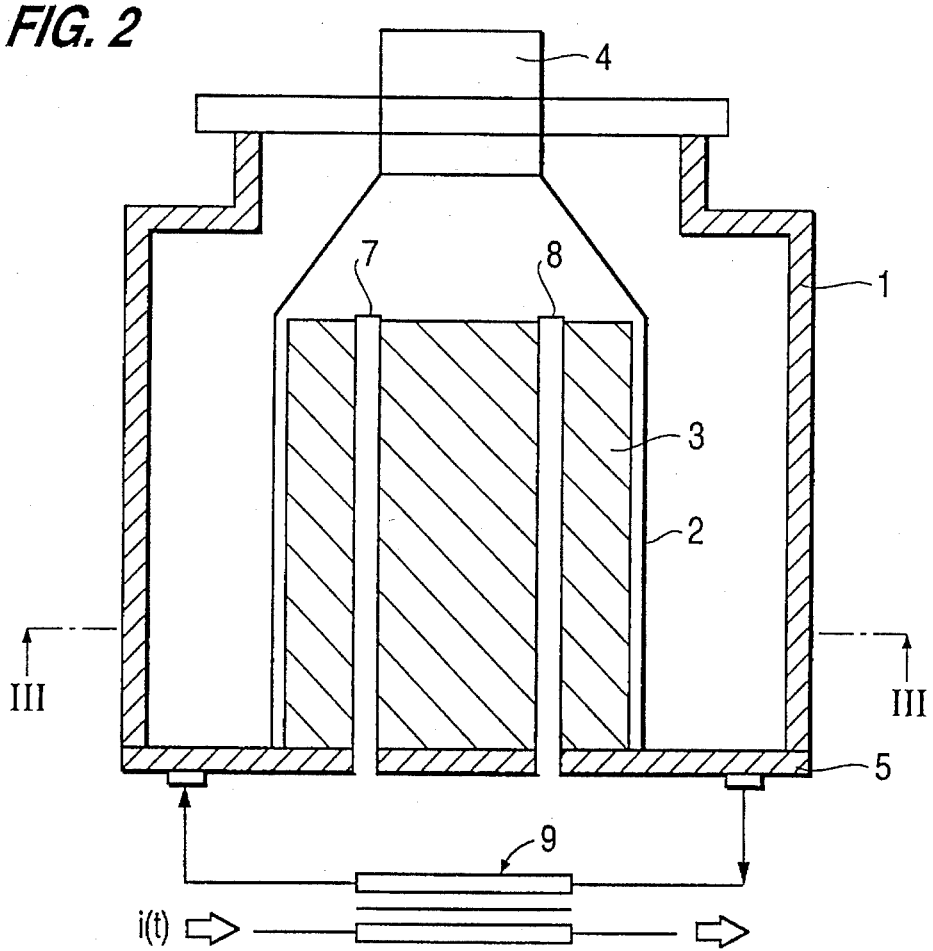
FIG. 2 is a top plan view of a strip transmission line (with the top of the housing removed) according to a preferred embodiment of the invention.
Figure 3:
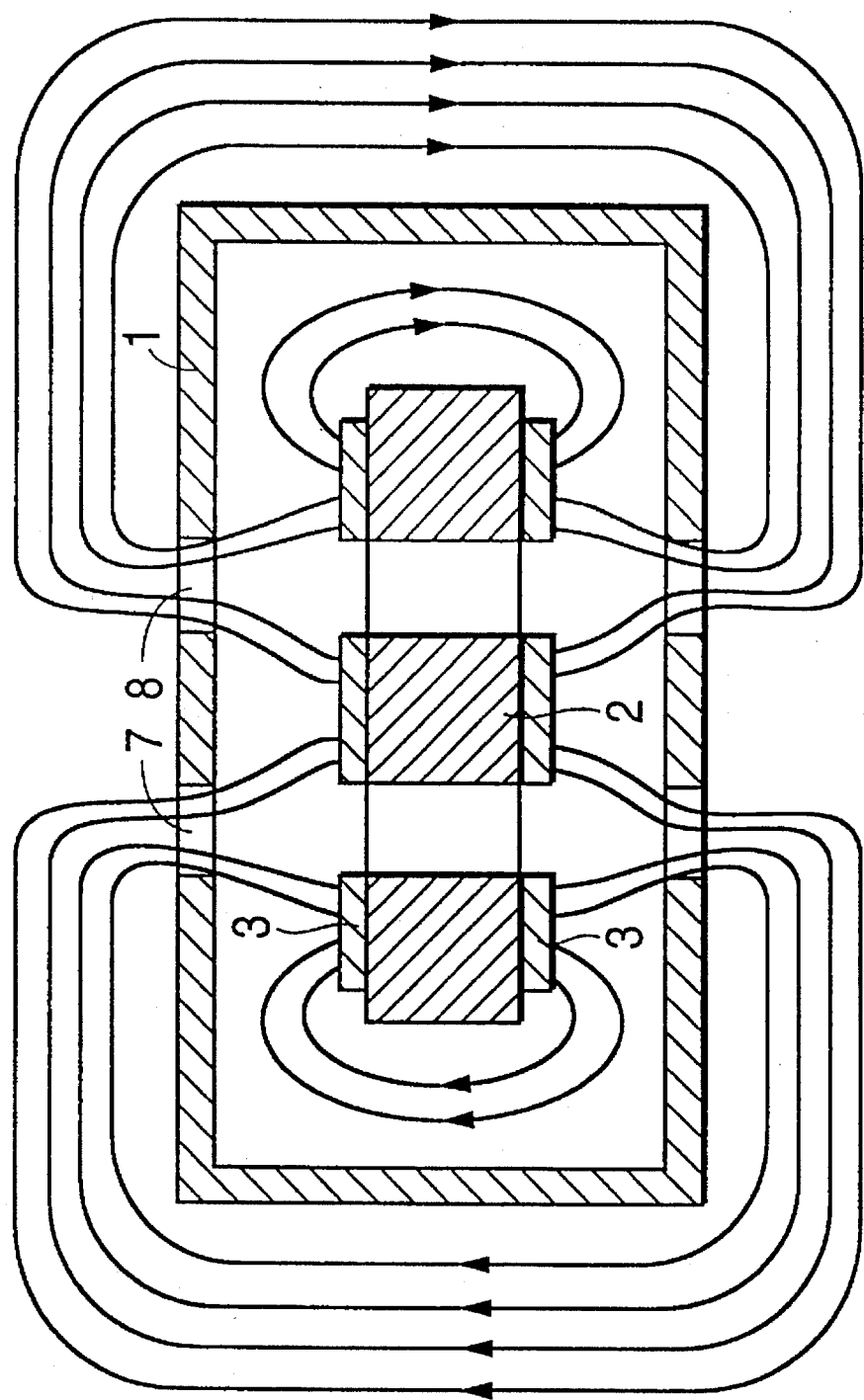
FIG. 3 is a sectional view taken along line III—III of FIG. 2.

FIGS. 2 and 3 show that two slots 7 and 8 are provided which are oriented in the direction of wave propagation and which cut through the outer conductor 1, the inner conductor 2, as well as the short circuiting plate 5. The two slots 7 and 8 terminate prior to the transition of the strip transmission line into the coaxial waveguide 6, 4. The two slots 7 and 8 divide the outer conductor 1 and the inner conductor 2 into a mid portion and two flanking (outer) portions of the strip transmission line. If a current i(t) is applied to one of the two outer portions which is returned by the other outer portion, a magnetic field is directly generated in the inside of the strip transmission line as illustrated in FIG. 3. Since the impedance of the housing 1 of the strip transmission line is very low, expediently a transformer 9 is used which transforms the current i(t) flowing in the primary side to a high premagnetizing current (up to 1,000 A) applied by the secondary side to the strip transmission line. The terminals of the secondary side of the transformer 9 are connected with the short circuiting plate sections which connect the inner and outer conductors of the respective strip transmission line sections, as shown in FIG. 2.

While in the described embodiment two slots 7 and 8 are provided in the strip transmission line 1, 2, it is to be understood that even a single slot is sufficient to subdivide the inner and outer conductors 1, 2 as well as the short circuiting plate 5 of the strip transmission line into two sections for the forward and reverse path of the current. Under certain circumstances, for example, in order to obtain a particular characteristic of the premagnetizing field, it is appropriate to provide more than only two current paths. In such a case then more than two slots are provided in the strip transmission line.

Figure 4:
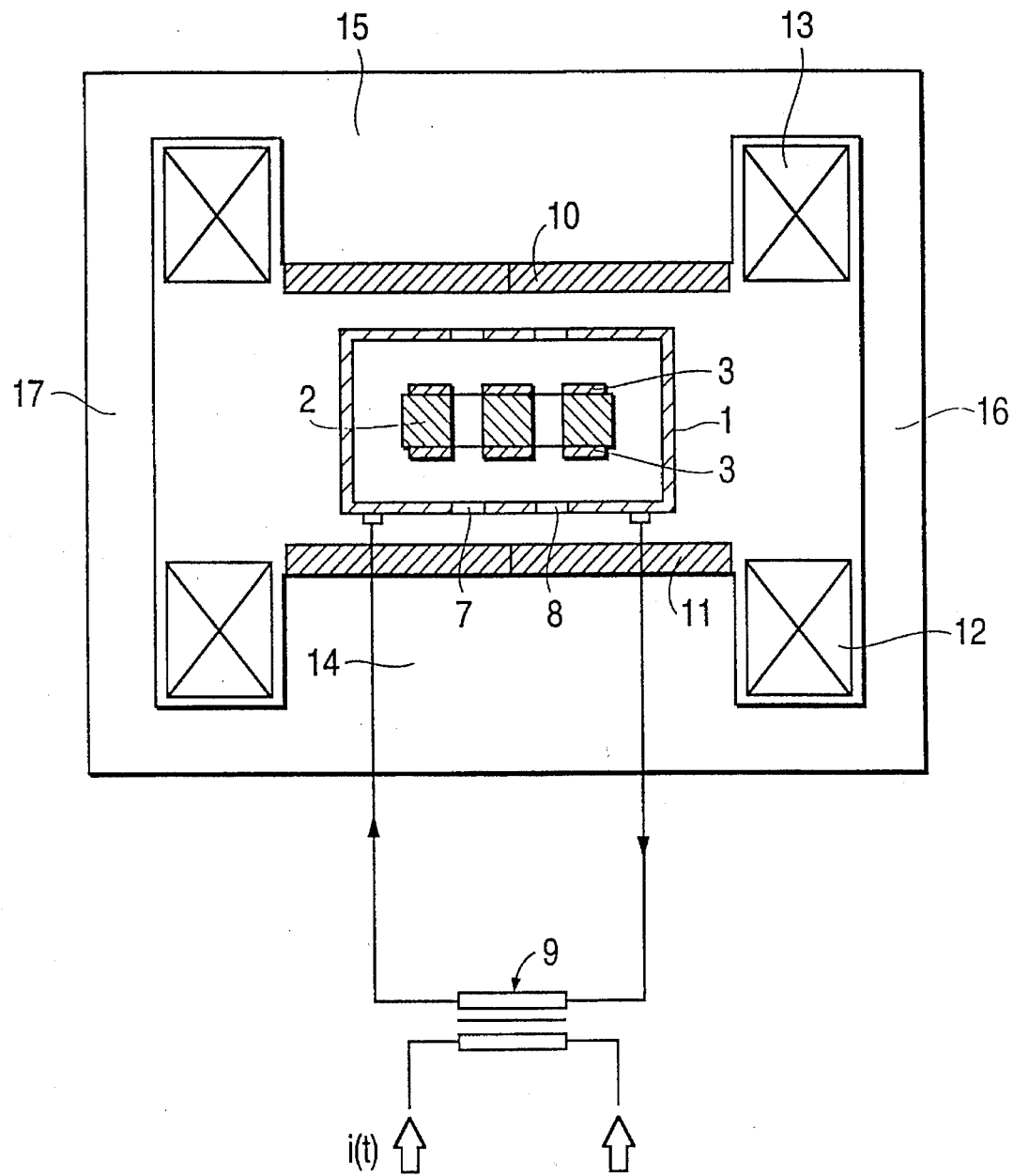
FIG. 4 is a top plan view of the preferred embodiment complemented with a permanent magnet and an electromagnet.

In the construction according to FIG. 4, several premagnetizing systems are provided for the slotted strip transmission line 1, 2. One of the systems is formed of a permanent magnet assembly composed of two individual permanent magnets 10 and 11 between which the strip transmission line 1, 2 is so arranged that the static magnetic field is oriented perpendicularly to those sides of the inner conductor 2 and/or the outer conductor 1 which are provided with the ferrite layer 3. In addition, the above-described current-applying arrangement is provided with which, in the inside of the strip transmission line, a premagnetizing field may be generated which can be altered with a high frequency (1 kHz to 100 kHz). There is further provided an electromagnet generating a premagnetizing field which is variable with a lower frequency (up to 1 kHz) and which penetrates through the housing 1 into the ferrite layer 3. The electromagnet is conventionally formed of two solenoids 12, 13 wound on two iron cores 14, 15. The magnetic air gap for the electromagnets is defined by the distance between the two iron cores 14, 15. The scatter field of this magnet system may be maintained at a small value by providing, externally of the air gap, a soft iron magnetic feedback component 16, 17.

The current supplied by a tuning amplifier for the premagnetizing system may be divided by means of high-pass and low-pass filter circuits into a low-frequency current for the electromagnets and a high-frequency current for the slotted strip transmission line.

It will be understood that the above description of the present invention is susceptible to various modifications, changes and adaptations, and the same are intended to be comprehended within the meaning and range of equivalents of the appended claims.

What is claimed is:

1. A strip transmission line for guiding a wave therein, comprising (a) a strip-shaped inner conductor;
   (b) an outer conductor surrounding said inner conductor;
   (c) a ferrite coating carried on at least one of the conductors; and
   (d) at least one throughgoing slot in said inner and outer conductors for dividing said inner and outer conductors into at least two inner conductor sections and at least two outer conductor sections; said slots extending in a direction of wave propagation, whereby a variable current applied to said inner and outer conductors flows in one direction in one of the inner and outer conductor sections and returns in an opposite direction in another of said inner and outer conductor sections for generating a variable premagnetizing field within the strip transmission line between said inner and outer conductors to vary an electric length of the strip transmission line.

2. A strip transmission line system comprising (a) a strip transmission line for guiding a wave therein, said strip transmission line including
      (1) a strip-shaped inner conductor;
      (2) an outer conductor surrounding said inner conductor;
      (3) a ferrite coating carried on at least one of the conductors; and
      (4) at least one throughgoing slot in said inner and outer conductors for dividing said inner and outer conductors into at least two inner conductor sections and at least two outer conductor sections; said slots extending in a direction of wave propagation; and
   (b) current supplying means for applying a variable current to said inner and outer conductors to cause the variable current to flow in one direction in one of the inner and outer conductor sections and return in an opposite direction in another of said inner and outer conductor sections; the variable current generating a variable premagnetizing field within the strip transmission line between said inner and outer conductors to vary an electric length of the strip transmission line.

3. The strip transmission line system as defined in claim 2, wherein said current supplying means includes a transformer connected to said inner and outer conductor sections.

4. The strip transmission line system as defined in claim 2, wherein said premagnetizing field is a first premagnetizing field having a first frequency; further comprising an electromagnet surrounding said strip transmission line and generating a second premagnetizing field penetrating into said strip transmission line, said second premagnetizing field having a second frequency being lower than said first frequency.

5. The strip transmission line system as defined in claim 2, further comprising permanent magnet means for premagnetizing said ferrite layer to saturation.

* * * * *

UNITED STATES PATENT AND TRADEMARK OFFICE
CERTIFICATE OF CORRECTION

PATENT NO.   : 5,510,756
DATED        : April 23, 1996
INVENTOR(S)  : Wolfgang Arnold et al It is certified that error appears in the above-indentified patent and that said Letters Patent is hereby corrected as shown below:

On the title page, item [75], the fourth inventor's first name should read --Siegbert--.

Signed and Sealed this

Twentieth Day of August, 1996

Attest:

BRUCE LEHMAN

*Attesting Officer*          *Commissioner of Patents and Trademarks*